(12) United States Patent
Abad et al.

(10) Patent No.: US 10,388,516 B1
(45) Date of Patent: Aug. 20, 2019

(54) METHOD FOR POLYMER-ASSISTED CHIP TRANSFER

(71) Applicant: Facebook Technologies, LLC, Menlo Park, CA (US)

(72) Inventors: Oscar Torrents Abad, Saarbrucken (DE); Pooya Saketi, Cork (IE); Daniel Brodoceanu, Saarbrucken (DE); Karsten Moh, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/867,389

(22) Filed: Jan. 10, 2018

(51) Int. Cl.
*H01L 21/50* (2006.01)
*H01L 21/02* (2006.01)
*H01L 23/00* (2006.01)

(52) U.S. Cl.
CPC .. *H01L 21/02354* (2013.01); *H01L 21/02118* (2013.01); *H01L 24/29* (2013.01); *H01L 24/30* (2013.01); *H01L 24/33* (2013.01); *H01L 24/98* (2013.01); *H01L 2224/27848* (2013.01); *H01L 2224/2919* (2013.01); *H01L 2224/30505* (2013.01); *H01L 2224/30519* (2013.01); *H01L 2224/32225* (2013.01); *H01L 2224/33505* (2013.01); *H01L 2224/83035* (2013.01); *H01L 2224/83039* (2013.01); *H01L 2224/83104* (2013.01); *H01L 2224/83192* (2013.01); *H01L 2224/83939* (2013.01); *H01L 2224/83948* (2013.01); *H01L 2224/98* (2013.01)

(58) Field of Classification Search
CPC .. H01L 21/02118; H01L 21/02345–21/02354; H01L 24/27; H01L 24/29; H01L 24/30; H01L 24/32; H01L 24/33; H01L 24/83; H01L 24/98; H01L 2224/30505; H01L 2224/30517; H01L 2224/30519; H01L 2224/32225; H01L 2224/98; H01L 2224/33505; H01L 2224/83939; H01L 2224/83935; H01L 2224/27848; H01L 2224/2919; H01L 2224/16225; H01L 2224/83948; H01L 2224/27849
See application file for complete search history.

(56) References Cited

U.S. PATENT DOCUMENTS

| | | | |
|---|---|---|---|
| 7,883,991 B1 * | 2/2011 | Wu | H01L 21/6835 257/686 |
| 9,252,111 B2 * | 2/2016 | Lee | H01L 23/5384 |
| 9,318,473 B2 * | 4/2016 | Mahler | H01L 25/16 |
| 2016/0133486 A1 * | 5/2016 | Andry | H01L 21/78 428/40.4 |
| 2016/0204015 A1 * | 7/2016 | Allen | H01L 25/03 438/667 |

* cited by examiner

*Primary Examiner* — Michael M Trinh
(74) *Attorney, Agent, or Firm* — Fenwick & West LLP

(57) ABSTRACT

One or more chips are transferred from one substrate to another by using one or more polymer layers to secure the one or more chips to an intermediate carrier substrate. While secured to the intermediate carrier substrate, the one or more chips may be transported or put through further processing or fabrication steps. To release the one or more chips, the adhesion strength of the one or more polymer layers is gradually reduced to minimize potential damage to the one or more chips.

17 Claims, 3 Drawing Sheets

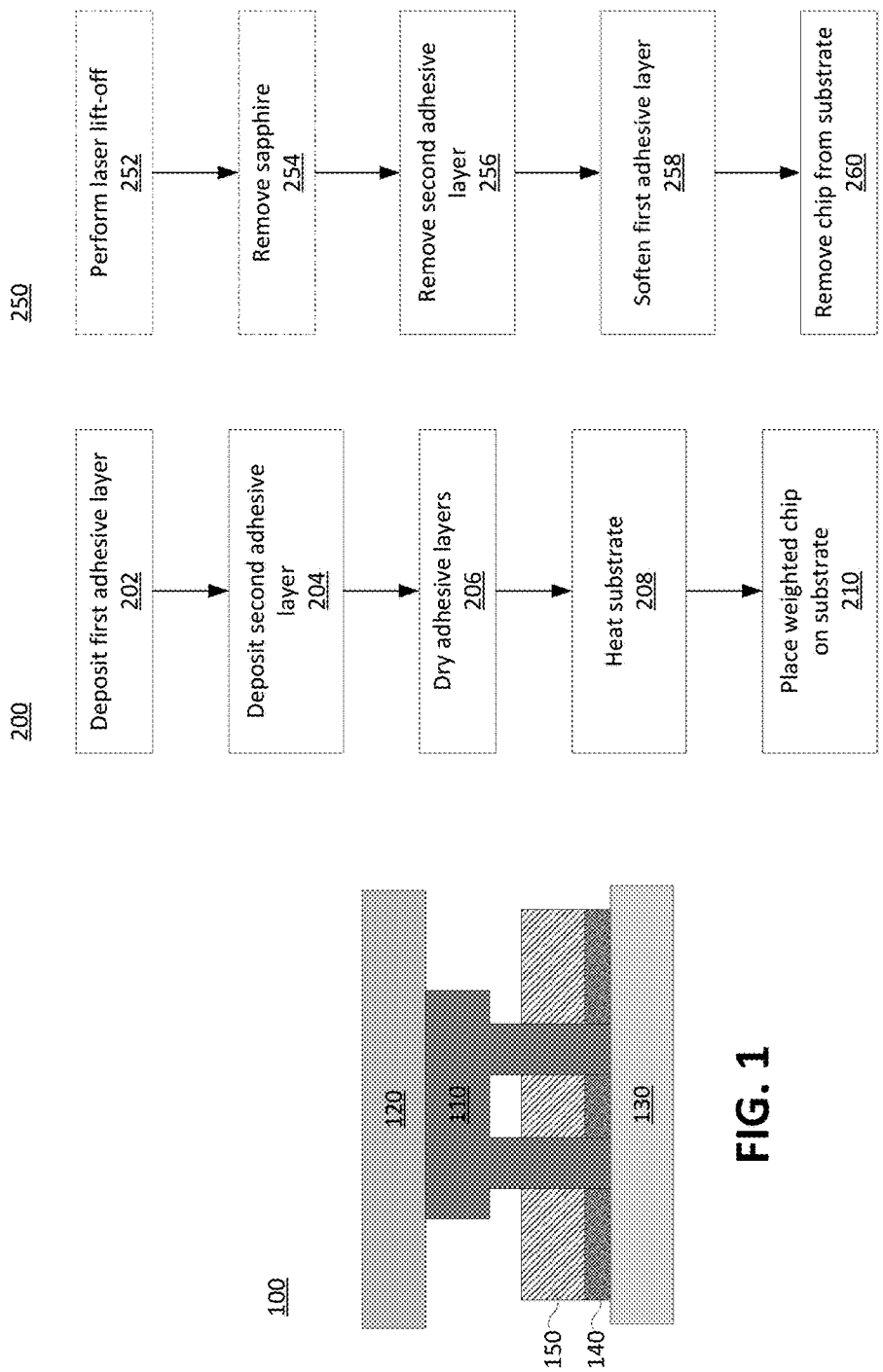

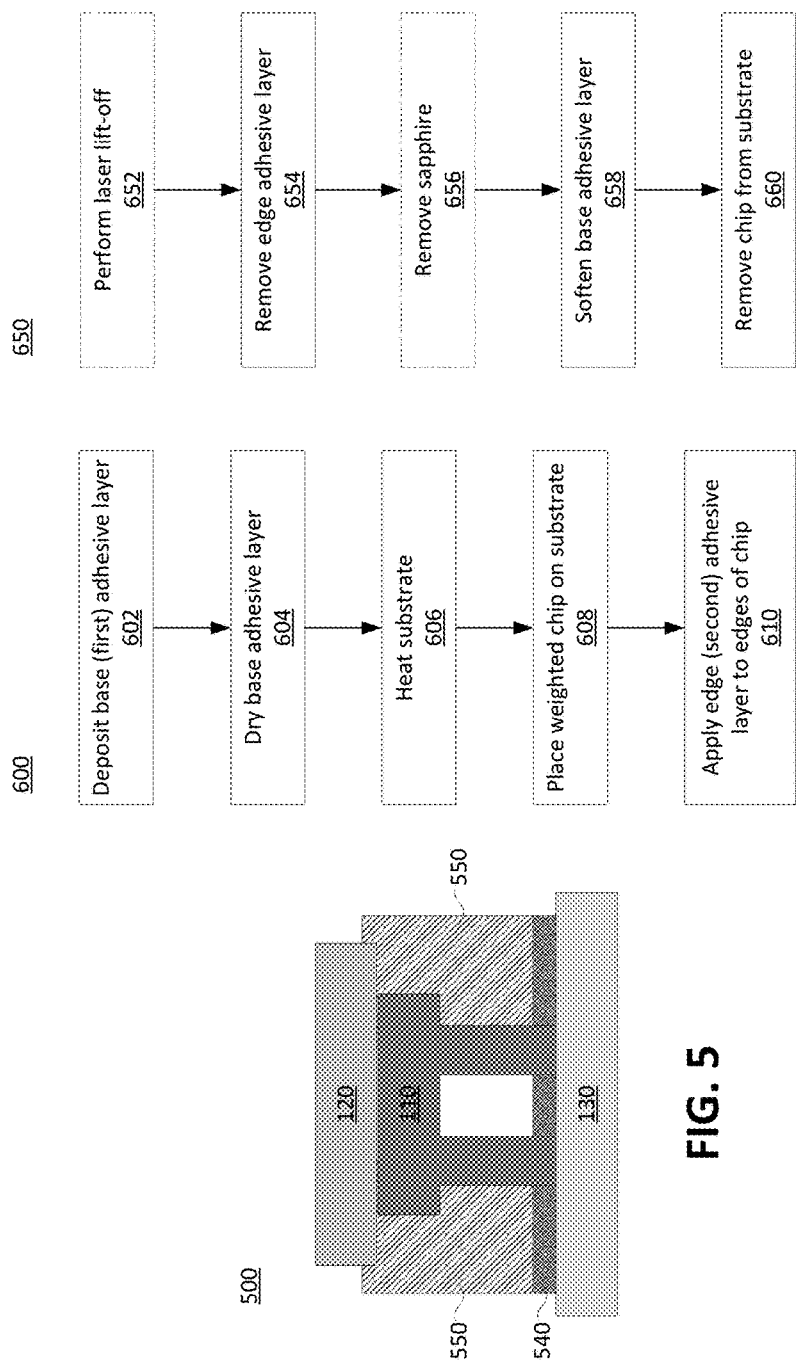

METHOD FOR POLYMER-ASSISTED CHIP TRANSFER

TECHNICAL FIELD

The present disclosure relates to chip fabrication, and more specifically to transferring chips from one substrate to another during a fabrication process.

BACKGROUND

Semiconductor device fabrication often involve multiple steps that may require that at least part of the device be strongly secured at times, such as to a substrate. For example, when transporting a partially-fabricated semiconductor device, it is desirable that the device to be secured to the substrate strongly enough so that it does not shift or become detached from the substrate. Similarly, it is also desirable for the device to be secured during certain fabrication processes. One such process is laser lift-off (LLO), which is used to detach semiconductor devices from a substrate they are chemically adhered to. During LLO, a laser is focused on the interface of a substrate and base of the semiconductor device, often sapphire and gallium nitride, respectively. As the laser heats the interface, the bonds at the interface are broken, and the substrate can subsequently be removed. However, the devices need to be kept in place during the LLO process to avoid damaging the devices.

LLO may be part of a larger "chip transfer" process through which semiconductor device chips are removed from one substrate and placed onto another. Adhesive tapes are conventionally used for chip transfer processes and may be heat- or UV-release materials. However, such tapes are not suitable for ultra-fine-pitch interconnects (e.g., <10 μm pitch, <5 μm diameter, <5 μm height). Adhesive tapes are only able to provide a single level of adhesion, which is often too strong and prevents reliable chip release. Smaller devices especially may be damaged upon removal when the adhesion strength is too high. Alternatively, if the adhesion strength is too low, the devices may be disrupted during transportation or processing (such as LLO). Furthermore, adhesive tapes are highly flexible, which can cause chip misalignment during and after the transfer process.

SUMMARY

One or more chips are transferred from one substrate to another by using one or more adhesive layers to secure the one or more chips to an intermediate carrier substrate. While secured to the intermediate carrier substrate, the one or more chips may be transported or put through further processing or fabrication steps. To release the one or more chips, the adhesion strength of the one or more polymer layers is gradually reduced to minimize potential damage to the one or more chips.

In one embodiment, one or more chips are secured to a first substrate by depositing a first adhesive layer on the first substrate, depositing a second adhesive layer that is made of a different material than the first adhesive layer on the first substrate, and placing one or more chips on the first substrate through the first and second adhesive layers. The one or more chips are detached from the first substrate by removing the second adhesive layer from the first substrate, softening the first adhesive layer, and removing the one or more chips from the first substrate.

In another embodiment, one or more chips are secured to a first substrate by depositing a polymer layer on the first substrate, and placing one or more chips on the first substrate through the polymer layer, such that one or more portions of the polymer layer covering edges of the one or more chips. The polymer layer is then dried, such as by evaporation. The one or more chips are detached from the first substrate by removing the one or more portions of the polymer layer from the edges of the one or more chips, softening one or more remaining portions of the polymer layer, and removing the one or more chips from the first substrate.

In yet another embodiment, one or more chips are secured to a first substrate by depositing a first adhesive layer on the first substrate, placing one or more chips on the first substrate through the first adhesive layer, and depositing a second adhesive layer on the first substrate. The second adhesive layer is made of a different material than the first adhesive layer and comes into contact with a second substrate the one or more chips are attached to. The second adhesive layer covers edges of second substrate and some edges of the one or more chips but does not cover other portions of the one or more chips. The one or more chips are detached from the first substrate by removing the second adhesive layer from the first substrate, softening the first adhesive layer, and removing the one or more chips from the first substrate.

BRIEF DESCRIPTION OF THE DRAWINGS

Exemplary implementations of the present disclosure are described herein with reference to the accompanying drawings, in which:

FIG. 1 shows a cross-sectional view of a chip secured to a carrier substrate via a double adhesive layer, according to one embodiment.

FIG. 2A is a flow chart of a method for attaching the chip to the carrier substrate via a double adhesive layer, according to one embodiment.

FIG. 2B is a flow chart of a method for releasing the chip that is attached to the carrier substrate via a double adhesive layer, according to one embodiment.

FIG. 5 shows a cross-sectional view of the chip secured to a carrier substrate via an edge double adhesive layer, according to one embodiment.

FIG. 6A is a flow chart of a method for securing the chip to the carrier substrate via an edge double adhesive layer, according to one embodiment.

FIG. 6B is a flow chart of a method for releasing a chip that is attached to a carrier substrate via an edge double adhesive layer, according to one embodiment.

Figure 4B:
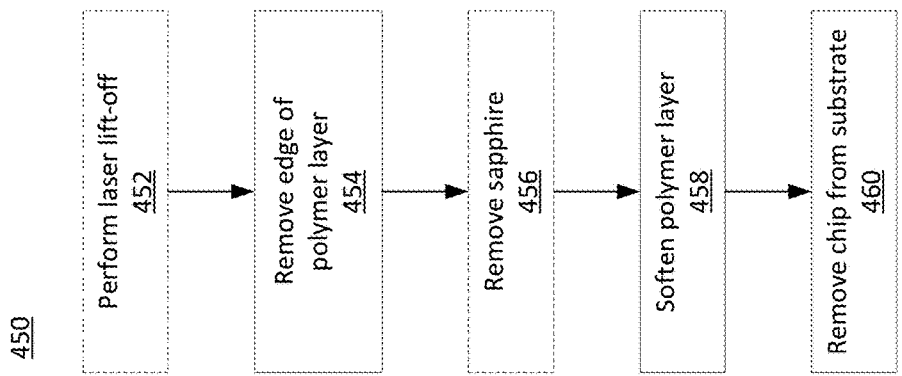
FIG. 4B is a flow chart of a method for releasing the chip that is attached to the carrier substrate via the single polymer layer, according to one embodiment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Generally disclosed herein are methods for transferring chips from one substrate to another using one or more adhesive layers to secure a chip to a surface of the substrate and reduce the adhesion strength of the one or more adhesive layers when removing the chip from the surface. By doing this, the disclosed transfer methods are better able to secure the chip to the surface strongly enough for transportation and processes such as LLO, while also limiting damage of the chip upon removal from the surface.

Herein, a "chip" refers to a semiconductor device such as, but not limited to, a micro-light-emitting diode (microLED). In one embodiment, the chip is specifically a gallium nitride (GaN) microLED.

The chip transfer methods are explained below for a single example chip being transferred from a "fabrication substrate" to a "target substrate" via a "carrier substrate." The fabrication substrate is a substrate that the chip is attached to before it is transferred, such as a substrate the chip was fabricated on. Example fabrication substrates include sapphire and silicon. The target substrate is a substrate the chip is placed on after it is transferred. For example, the chip may be placed on a target substrate where it is part of a larger device, such as a microLED array. The carrier substrate is a hard material, which reduces the planar flexibility of the adhesive layer(s) used to adhere the chip to the carrier substrate. Thus, the combination of the hard carrier substrate and the adhesive layer(s) form a rigid adhesive surface. Example carrier substrates include glass and silicon. The fabrication and/or target substrates may not be involved in some embodiments of the disclosed methods. For example, one or more chips may have already been removed from their fabrication substrate and before being secured to the carrier substrate.

The adhesive materials discussed in conjunction with the disclosed methods include waxes, such as carnauba wax and bees wax, and polymer materials. The following polymer materials are specifically discussed: polyvinyl alcohol (PVA), polyvinyl acetate (PVAc), polyvinyl pyrrolidone (PVP), and polyvinyl butyral (PVB). However, these adhesive materials are merely examples, as many different adhesive materials that meet the requirements described may be used in these methods. For example, the adhesive materials need not be limited to waxes and vinyl polymers.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Double Adhesive Layer System

FIGS. 1, 2A, and 2B illustrate a double adhesive layer chip transfer system, according to one embodiment. FIG. 1 shows a cross-sectional view 100 of the chip 110 (on a fabrication substrate 120) secured to a carrier substrate 130 via a double adhesive layer, according to one embodiment. A first adhesive layer 140 is on the surface of the carrier substrate 130, while a second adhesive layer 150 is on top of the surface of the first adhesive layer 140. The adhesion strength of the double adhesive layer system can be controlled by the thicknesses of the adhesive layers 140 and 150. For example, the first adhesive layer 140 may be thinner than the second adhesive layer 150, as shown in FIG. 1. Adhesive layer thicknesses are further discussed in conjunction with FIG. 2A.

FIG. 2A is a flow chart of a method 200 for attaching the chip 110 to the carrier substrate 130 via a double adhesive layer, according to one embodiment. The first adhesive layer 140 is deposited 202 onto the carrier substrate 130 and the second adhesive layer 150 is deposited onto the first adhesive layer 140. The adhesive layers 140 and 150 may be deposited 202 and 204 using standard thin film deposition techniques, such as spin-coating and dip-coating.

The first and second adhesive layers 140 and 150 are made of adhesive materials with different properties that allow them to be removed separately. Specifically, the first and second materials are soluble in different solvents and/or able to be dry etched by different chemical species. For example, the first material (of the first adhesive layer 140) is soluble in a first solvent in which the second material (of the second adhesive layer 150) is insoluble, and the second material may be soluble in a second solvent in which the first material is insoluble. At least one of the first and second materials is a polymer material. The other of the first and second materials may be a wax, such as carnauba or bees wax, or another polymer material. In one embodiment, the first material is a polymer material and the second material is a wax. Specifically, the second material may be carnauba wax. In another embodiment, the first material is PVAc and the second material is PVA. In yet another embodiment, the first material is PVP and the second material is PVB. Additionally or alternatively, the first and second materials have different glass transition temperatures, which allows the adhesion properties of the first and second adhesive layers 140 and 150 to be modified individually.

The first and second adhesive layers 140 and 150 may be of different thicknesses, so as to control the total level of adhesion and the reduced level of adhesion after the second adhesive layer 150 is removed. In one embodiment, the first adhesive layer 140 is approximately 1 micrometer thick, and the second adhesive layer 150 is 2-3 micrometers thick.

In some embodiments, the adhesive layers 140 and 150 are dried 206, such as by evaporation, an electron beam, UV radiation, heat, or chemical drying agents.

The carrier substrate 130 is heated 208 to soften the adhesive layers 140 and 150 in preparation for chip placement 210. The temperature for softening the adhesive layers 140 and 150 is dependent on the type of adhesive material being used. Typically, the temperature that the carrier substrate 130 is heated 208 at least to the glass transition temperatures of the adhesive layers 140 and 150. For example, the carrier substrate 130 is heated to at least 85° C. if the adhesive layers 140 and 150 are PVAc and PVA, and the carrier substrate 130 is heated to at least 110-180° C. if the adhesive layers are PVP and PVB.

The chip 110 is weighted (e.g., with a few grams) and placed 210 on the heated carrier substrate 130, through the second adhesive layer 150 and the first adhesive layer 140. The chip 110 is fully secured to the carrier substrate 130 once the temperature returned to below the glass transition temperature of one or both of the adhesive materials, fixing the chip 110 in place and increasing the level of adhesion.

FIG. 2B is a flow chart of a method 250 for releasing the chip 110 that is attached to the carrier substrate 130 via a double adhesive layer (made of adhesive layers 140 and 150), according to one embodiment. Method 250 includes optional processing steps (indicated in dotted lines) through which the fabrication substrate 120 can be removed. These are an example of what processing may require a stronger level of adhesion. Alternatively or additionally, the carrier substrate 130 may be used to secure the chip 110 for transport or shipping.

While the chip 110 is strongly adhered to the carrier substrate 130, the fabrication substrate 120 may be removed by performing 252 laser lift-off or a similar process to break any physical and/or chemical bonds between the chip 110 and the fabrication substrate 120. Once those bonds are broken, the fabrication substrate 120 can be physically removed 254 from the chip 110. The fabrication substrate 120 may be heated to aid in its removal 254. For example, a sapphire fabrication substrate 120 is heated to 30° C. prior to removal 254.

After the fabrication substrate 120 has been removed 254, the level of adhesion between the chip 110 and the carrier substrate 130 is decreased by removing 256 second adhesive layer 150 from the carrier substrate 130 and the chip 110. The chip 110 remains adhered to the carrier substrate 130 via the first adhesive layer 140. In one embodiment, the second adhesive layer 150 is removed 254 by the rinsing carrier substrate 130 with a solvent in which the second adhesive layer 150 is soluble but the first adhesive layer 140 is not. Example solvents include water, butanone, ethanol, and isopropanol. Specifically, the carrier substrate 130 is rinsed with water if the second adhesive layer 150 is PVA (and the first adhesive layer 140 is not PVP), with butanone if the second adhesive layer 150 is PVAc, with water (if the first adhesive layer 140 is not PVA) or isopropanol if the second adhesive layer 150 is PVP, and the carrier substrate 130 is rinsed with ethanol if the second adhesive layer 150 is PVB.

The carrier substrate 130 is heated 258 to soften the first adhesive later 140 so that the chip 110 can be removed 260 from the carrier substrate 260 (e.g., so it can be placed on a target substrate). Again, the temperature that the carrier substrate 130 is heated to depends on the adhesive material being used. For example, the carrier substrate 130 is heated to at least 45° C. when the first adhesive layer 140 is PVAc, or to at least 110-180° C. when the first adhesive layer 140 is PVP. Alternatively or additionally, the first adhesive layer 140 can be dry etched to reduce its adhesion strength before removing 260 the chip 110 from the carrier substrate 130.

Single Polymer Layer System

Figure 4A:
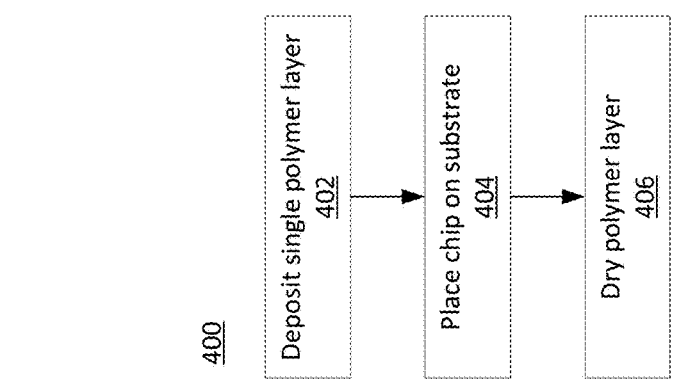
FIG. 4A is a flow chart of a method for securing the chip to the carrier substrate via a single polymer layer, according to one embodiment.
Figure 3:
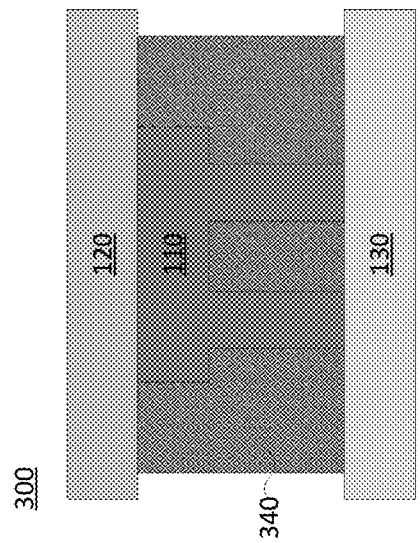
FIG. 3 is a cross-sectional view of the chip secured to the carrier substrate via a single polymer layer, according to one embodiment.

FIGS. 3, 4A, and 4B illustrate a single polymer layer chip transfer system. FIG. 3 shows a cross-sectional view 300 of the chip 110 (on the fabrication substrate 120) secured to the carrier substrate 130 via a single polymer layer 340, according to one embodiment. The single polymer layer 340 is on the surface of the carrier substrate 130 and may also come into contact with the fabrication substrate 120. In this embodiment, adhesion strength is controlled by the amount of the polymer layer 340 that is removed 454, which is discussed in conjunction with FIG. 4B.

FIG. 4A is a flow chart of a method 400 for securing the chip 110 to the carrier substrate 130 via a single polymer layer 340, according to one embodiment. The carrier substrate 130 is prepared by depositing 402 the single polymer layer 340 on the carrier substrate 130. The polymer layer 340 may be deposited 202 using standard thin film deposition techniques, such as spin-coating and dip-coating.

The polymer layer 340 is made of a polymer material that is able to be selectively removed by a laser, which is further described in conjunction with FIG. 4B. Examples of possible polymer materials include PVAc, PVA, PVP, and PVB. The thickness of the polymer layer 340 is such that the chip 110 can be fully embedded in the polymer layer 340 with the fabrication substrate 120 also coming into contact with the polymer layer 340. For example, the thickness of the polymer layer 340 may be approximately equal to or a little less than a height of the chip 110.

The chip 110 is placed 404 on the carrier substrate 130, through the polymer layer 340. After placement 404, the sides of the chip 110 contact the polymer layer 340. The sides of any morphology on the bottom of the chip 110, such as ridges or prongs, also comes into contact with the polymer layer 340.

In some embodiments, the polymer layer 340 is dried 406, such as by evaporation, an electron beam, UV radiation, heat, or chemical drying agents, before or after chip 110 placement 404. If the polymer layer 340 is dried before chip 110 placement 404, the carrier substrate 130 may also be heated (similarly to step 208 of method 200) before chip 110 placement 404 in order to soften the polymer layer 340.

FIG. 4B is a flow chart of a method 450 for releasing the chip 110 that is attached to the carrier substrate 130 via the single polymer layer 340, according to one embodiment. Method 450 includes optional processing steps (indicated in dotted lines) through which the fabrication substrate 120 can be removed. These are an example of what processing steps may require a stronger level of adhesion. Alternatively or additionally, the carrier substrate 130 may be used to secure the chip 110 for transport or shipping.

While the chip 110 is strongly adhered to the carrier substrate 130, the fabrication substrate 120 may be removed by performing 452 LLO or a similar process to break any physical and/or chemical bonds between the chip 110 and the fabrication substrate 120.

To decrease the adhesion strength of the polymer layer 340, portions of the polymer layer 340 covering the edges of the chip 110 are removed 454 from the carrier substrate 130. The portions of the polymer layer 340 that are removed 454 include any portions of the polymer layer 340 contacting the edges of the fabrication substrate 120. In some embodiments, portions of the polymer layer 340 contacting the underside of the fabrication substrate 120 may not be removed 454. The removal 454 may be performed via a laser, such as a carbon dioxide laser.

The removal 454 of portions of the polymer layer 340 dislodges the fabrication substrate 120 so that it can be removed 456 from the chip 110. The fabrication substrate 120 may be heated to aid in its removal 456. For example, a sapphire fabrication substrate 120 is heated to 30° C. prior to removal 456. In some embodiments, steps 454 and 456 may be reversed.

The carrier substrate 130 is heated 458 to soften the remaining portions of the polymer later 340 so that the chip 110 can be removed 460 from the carrier substrate 130 (e.g., so it can be placed on a target substrate). The temperature that the carrier substrate 130 is heated to depends on the polymer material being used. For example, the carrier substrate 130 is heated to at least 85° C. when the polymer layer 340 is PVA, at least 45° C. when the polymer layer 340 is PVAc, to at least 110-180° C. when the polymer layer 340 is PVP, or to at least 62-78° C. when the polymer layer 340 is PVB. Alternatively or additionally, the polymer layer 340 can be dry etched to reduce its adhesion strength before removing 460 the chip 110 from the carrier substrate 130.

Edge Double Adhesive Layer System

FIGS. 5, 6A, and 6B illustrate an edge double adhesive layer chip transfer system, according to one embodiment. FIG. 5 is a cross-sectional view 500 of the chip 110 (on a fabrication substrate 120) secured to a carrier substrate 130 via an edge double adhesive layer, according to one embodiment. A base adhesive layer 540 is on the surface of the carrier substrate 130. An edge adhesive layer 550 is the on the surface of the base adhesive layer 540, but only around the sides and edges of the chip 110. The adhesion strength of the edge double adhesive layer system can be controlled by the thicknesses of the adhesive layers 540 and 550. For example, the base adhesive layer 540 may be thinner than the edge adhesive layer 550, as shown in FIG. 5. Adhesive layer thicknesses are further discussed in conjunction with FIG. 6A.

FIG. 6A is a flow chart of a method 600 for securing the chip 110 to the carrier substrate 130 via an edge double adhesive layer (made up of adhesive layers 540 and 550), according to one embodiment. The base adhesive layer 540 is deposited 602 onto the carrier substrate 130 using standard thin film deposition techniques, such as spin-coating and dip-coating.

The base adhesive layer 540 and the edge adhesive layer 550 are made of adhesive materials with different properties such that they can be removed separately. The example combinations of materials discussed with respect to the double adhesive layer chip transfer system of FIGS. 1, 2A, and 2B may also be used for the edge double adhesive layer chip transfer system discussed here. Specifically, at least one of the base and edge adhesive layers 540 and 550 is a polymer material, and, in some embodiments, the other of the base and edge adhesive layers 540 and 550 is a wax, such as carnauba wax or bees wax. In one embodiment, the base adhesive material comprises PVAc and the edge adhesive material is PVA. In another embodiment, the base adhesive material comprises PVP and the edge adhesive material is PVB. The thickness of the base adhesive layer 540 controls the reduced adhesion strength of the edge double adhesive layer system. Accordingly, the base adhesive layer 540 may be relatively thin to facilitate easy release of the chip 110. In one embodiment, the base adhesive layer 540 is approximately 1 micrometer thick.

In one embodiment, the base adhesive layer 540 is separated into a first base adhesive layer and a second base adhesive layer. The first and second base adhesive layers may be similar to the first and second adhesive layers 140 and 150 discussed in FIGS. 1, 2A, and 2B. They may be made of different materials with different properties and may be softened and/or removed independently.

The base adhesive layer 540 is dried 604, such as by evaporation, an electron beam, UV radiation, heat, or chemical drying agents.

The carrier substrate 130 is heated 606 to soften the base adhesive layer 540 in preparation for chip 110 placement 210. The temperature required to soften the base adhesive layer 540 depends on the type of adhesive material being used. Typically, the carrier substrate 130 is heated 606 at least to the glass transition temperatures of the base adhesive layer 540. For example, if the base adhesive layer 540 is PVAc, the carrier substrate 130 is heated to at least 85° C. prior to chip placement 210. Alternatively, when the base adhesive layer 540 is PVP, the carrier substrate 130 is heated to or past 110-180° C.

The chip 110 is weighted (e.g., with a few grams) and placed 608 on the heated carrier substrate 130, through the base adhesive layer 540. In some embodiments, the base adhesive layer 540 is not dried 604, the carrier substrate 130 is not heated 606, and the chip 110 is not weighted during placement 608.

After the chip 110 has been placed 608, the edge adhesive layer 550 is deposited around the edges of the fabrication substrate 120 and coming into contact of edges of the chip 110. In embodiments where multiple chips 110 are attached to the same fabrication substrate 120, the edge adhesive layer 550 only comes into contact with the outermost edges of the multiple chips 110. That is, the edge adhesive layer 550 does not come into contact with an edge of a chip 110 that is directly adjacent to an edge of another chip 110. The edge adhesive layer 550 may be deposited using convention deposition techniques, or more targeted deposition techniques, such as injection.

FIG. 6B is a flow chart of a method 650 for releasing a chip 110 that is attached to a carrier substrate 130 via an edge double adhesive layer (made up of adhesive layers 540 and 550), according to one embodiment. Method 650 includes optional processing steps (indicated in dotted lines) through which the fabrication substrate 120 can be removed. These are an example of what processing may require a stronger level of adhesion. Alternatively or additionally, the carrier substrate 130 may be used to secure the chip 110 for transport or shipping.

While the chip 110 is strongly adhered to the carrier substrate 130, the fabrication substrate 120 may be removed by performing 652 laser lift-off or a similar process to break any physical and/or chemical bonds between the chip 110 and the fabrication substrate 120.

The level of adhesion between the chip 110 and the carrier substrate 130 is decreased by removing 654 the edge adhesive layer 550 from the carrier substrate 130 and the chip 110. The chip 110 remains secured to the carrier substrate 130 via the base adhesive layer 540. In one embodiment, the edge adhesive layer 550 is removed 654 by the rinsing the carrier substrate 130 with a solvent in which the edge adhesive layer 550 is soluble but the base adhesive layer 540 is not. Example solvents include water, butanone, ethanol, and isopropanol. Specifically, the carrier substrate 130 is rinsed with water if the edge adhesive layer 550 is PVA (and the base adhesive layer 540 is not PVP), with butanone if the edge adhesive layer 550 is PVAc, with water (if the base adhesive layer 540 is not PVA) or isopropanol if the edge adhesive layer 550 is PVP, and the carrier substrate 130 is rinsed with ethanol if the base adhesive layer 550 is PVB.

After the edge adhesive layer 550 is removed 654, the fabrication substrate 120, however, is no longer attached to the chip 110 (via chemical/physical bonds or via the edge adhesive layer 550), so it can be removed 656 from the chip 110. The fabrication substrate 120 may be heated to aid in its removal 656. For example, a sapphire fabrication substrate 120 is heated to 30° C. prior to removal 656.

In some embodiments, the removal 654 of the edge adhesive layer 550 and the removal 656 of the fabrication substrate 120 can be combined. Specifically, the solvent used to remove 654 the edge adhesive layer 550 is heated above 30° C. such that it simultaneously dissolves the edge adhesive layer 550 and weakens the interface between the chip 110 and the fabrication substrate 120 (e.g., by melting a gallium layer between a gallium nitride chip 110 and a sapphire fabrication substrate 120 after LLO). Accordingly, both the edge adhesive layer 550 and the fabrication substrate 120 are removed 654 and 656 after application of the heated solvent. Combining these steps may be advantageous to minimize the handling of the chips 110 and avoid extra precautions to preserve the quality of the chips 110 during these steps.

The carrier substrate 130 is heated 658 to soften the base adhesive later 540 so that the chip 110 can be removed 660 from the carrier substrate 130 (e.g., so it can be placed on a target substrate). Again, the temperature that the carrier substrate 130 is heated to depends on the adhesive material being used. For example, the carrier substrate 130 is heated to at least 45° C. when the base adhesive layer 540 is PVA, or to at least 110-180° C. when the base adhesive layer 540 is PVP. Alternatively or additionally, the base adhesive layer 540 can be dry etched to reduce its adhesion strength before removing 660 the chip 110 from the carrier substrate 130.

Additional Considerations

Upon reading this disclosure, those of skill in the art will appreciate still additional alternative structural and functional designs for the described embodiments as disclosed from the principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method comprising:
   depositing a polymer layer on a first substrate, the polymer layer made of a polymer material;
   placing one or more chips on the first substrate through the polymer layer, the one or more chips attached to a second substrate, one or more portions of the polymer layer covering edges of the one or more chips and coming into contact with the second substrate;
   drying the polymer layer;
   performing laser lift-off on an interface of the one or more chips and the second substrate;
   removing the second substrate from the one or more chips after performing the laser lift-off;
   softening the polymer layer after removing the second substrate; and
   removing the one or more chips from the first substrate.

2. The method of claim 1, wherein the drying occurs after the one or more chips are placed.

3. The method of claim 1, wherein softening the polymer layer comprises heating the first substrate to at least a glass transition temperature of the polymer material.

4. The method of claim 1, further comprising:
   removing the one or more portions of the polymer layer covering the edges of the one or more chips before removing the second substrate.

5. The method of claim 4, wherein the one or more portions of the polymer layer are removed with a laser.

6. The method of claim 5, wherein the laser is a carbon dioxide laser.

7. The method of claim 1, wherein the polymer material is selected from a group consisting of polyvinyl acetate, polyvinyl pyrrolidone, polyvinyl alcohol, and polyvinyl butyral.

8. The method of claim 1, wherein the first substrate is made of is a hard material.

9. The method of claim 8, wherein the first substrate is made of glass.

10. A method comprising:
    securing one or more chips to a first substrate by:
       depositing a polymer layer on the first substrate, the polymer layer made of a polymer material,
       placing one or more chips on the first substrate through the polymer layer, one or more portions of the polymer layer covering edges of the one or more chips, and
       drying the polymer layer after placing the one or more chips; and
    detaching the one or more chips from the first substrate by:
       removing the one or more portions of the polymer layer from the edges of the one or more chips;
       softening one or more remaining portions of the polymer layer after removing the one or more portions of the polymer layer; and
       removing the one or more chips from the first substrate after softening the one or more remaining portions of the polymer layer.

11. The method of claim 10, further comprising:
    transporting the one or more chips while the one or more chips are secured to the first substrate.

12. The method of claim 10, further comprising:
    performing at least one fabrication step on the one or more chips while secured to the first substrate.

13. The method of claim 10, wherein the drying occurs after the one or more chips are placed.

14. The method of claim 10, further comprising:
    removing the one or more portions of the polymer layer covering the edges of the one or more chips before removing the second substrate.

15. The method of claim 14, wherein the one or more portions of the polymer layer are removed with a laser.

16. The method of claim 15, wherein the laser is a carbon dioxide laser.

17. The method of claim 10, wherein the polymer material is selected from a group consisting of polyvinyl acetate, polyvinyl pyrrolidone, polyvinyl alcohol, and polyvinyl butyral.

* * * * *